United States Patent
Tang et al.

(10) Patent No.: US 6,632,517 B1
(45) Date of Patent: Oct. 14, 2003

(54) LOW FIELD MAGNETORESISTANCE OF INTERGRANULAR TUNNELING IN FIELD-ALIGNED CHROMIUM DIOXIDE POWDERS

(75) Inventors: Jinke Tang, Metairie, LA (US); Jianbiao Dai, New Orleans, LA (US)

(73) Assignee: University of New Orleans Research and Technology Foundation, Inc., New Orleans, LA (US)

(*) Notice: Subject to any disclaimer, the term of this patent is extended or adjusted under 35 U.S.C. 154(b) by 27 days.

(21) Appl. No.: 09/934,458

(22) Filed: Aug. 21, 2001

Related U.S. Application Data

(60) Provisional application No. 60/226,638, filed on Aug. 21, 2000.

(51) Int. Cl.$^7$ .......................... G11B 5/39; B32B 33/00
(52) U.S. Cl. .................. 428/323; 428/328; 428/336; 428/692; 427/547; 427/550; 427/130
(58) Field of Search ................. 428/323, 328, 428/336, 692; 427/547, 550, 130

(56) References Cited

U.S. PATENT DOCUMENTS 5,543,226 A * 8/1996 Bobrich et al. .......... 428/423.1
5,856,008 A * 1/1999 Cheong et al. ............. 428/402
6,361,863 B1 * 3/2002 Gambino et al. ........... 428/402
6,429,497 B1 * 8/2002 Nickel ....................... 257/421

* cited by examiner

Primary Examiner—Stevan A. Resan
(74) Attorney, Agent, or Firm—Garvey, Smith, Nehrbass & Doody, L.L.C.; Seth M. Nehrbass

(57) ABSTRACT

The magnetic and magnetotransport properties of field-aligned single domain half-metallic $CrO_2$ powders have been studied. Needle-shaped nanoparticles of $CrO_2$ have been aligned in a strong magnetic field. The aligned powder sample shows a strong anisotropy along the alignment direction. The conduction mechanism of the aligned $CrO_2$ powder sample has been examined and is consistent with the intergranular spin dependent tunneling. Negative tunneling magnetoresistance (TMR) of about 41% is achieved in a small field in the vicinity of the coercive field at 5 K. The magnetoresistance (MR) versus field curve shows two well-separated narrow peaks at the coercive fields and resembles that of a magnetic tunnel junction. This junction-like MR results from the narrow switching field distribution of the aligned powders. The results suggest that the aligned magnetic $CrO_2$ particles may find novel applications in spin transport structures and devices.

19 Claims, 3 Drawing Sheets

LOW FIELD MAGNETORESISTANCE OF INTERGRANULAR TUNNELING IN FIELD-ALIGNED CHROMIUM DIOXIDE POWDERS

CROSS-REFERENCE TO RELATED APPLICATIONS

Priority of U.S. Provisional Patent Application Ser. No. 60/226,638, filed Aug. 21, 2000, incorporated herein by reference, is hereby claimed.

STATEMENT REGARDING FEDERALLY SPONSORED RESEARCH OR DEVELOPMENT

This invention was made in the performance of work under DoD/DARPA Grant No. MDA972-97-1-0003 through AMRI/UNO. The government may have rights in this invention.

REFERENCE TO A "MICROFICHE APPENDIX"

Not applicable

BACKGROUND OF THE INVENTION

1. Field of the Invention

The present invention relates to chromium dioxide. More particularly, the present invention relates to chromium dioxide powders.

2. General Background of the Invention

Half-metallic oxide $CrO_2$ has long been of importance in magnetic recording and shows unique magnetic properties. In 1986, it was predicted to be half-metallic by Schwarz using band structure calculation [1]. A number of experiments have been taken and confirmed its half-metallicity, including photoemission experiment [2], superconducting point contact experiment [3], and vacuum tunneling measurement [4]. It is suggested that half-metallic ferromagnets are ideal materials for the electrodes in spin dependent tunneling devices, such as those described by Moodera et al. [5]. Since the spin polarization is nearly 100% at the Fermi level, the tunneling junctions made of such materials would have an extremely large magnetoresistance (MR) and a very significant switching effect. It has been reported that $CrO_2$ thin films can have negative MR of about 13%–25% [6,7] at low temperature. In 1998, Manoharan et al. [8] and Coey et al. [9] studied the cold-pressed powder samples and found that the MR of the pressed compacts can reach as high as 30–50%. The conduction mechanism of these $CrO_2$ powder compacts arises from the spin dependent intergranular tunneling influenced by the Coulomb gap [9,10]. A $CrO_2$-I-Co magnetic tunneling junction using native oxide barrier has also been reported but with a small MR of about 1% [11].

The following U.S. Patent is incorporated herein by reference: U.S. Pat. No. 5,856,008. This patent discloses $CrO_2$ powders NOT aligned in a magnetic field, while the powders of the present invention are aligned in a magnetic field. Their data show magnetoresistance of 12% at 5 Kelvin and 20 kOe. The aligned powders of the present invention show magnetoresistance of greater magnitude at much lower field (41% magnetoresistance at 5 Kelvin and 1 kOe). Low field and high magnetoresistance are required for this to be usable.

BRIEF SUMMARY OF THE INVENTION

The present inventors have studied the magnetic and transport properties of aligned needle-shaped $CrO_2$ powders. The powders are aligned to the same direction in a strong magnetic field and then affixed to a substrate. The sample is strongly anisotropic owing to the shape anisotropy of the particles. The spin dependent intergranular tunneling is the major conduction mechanism of the $CrO_2$ aligned powders. A large negative MR of about 41% has been found at 5 K, and the magnetoresistance shows two well-separated peaks at the coercivity fields (+1000 Oe), which bears a resemblance to the behavior of the magnetic tunneling junctions.

It is suggested that the described switching characteristics of the aligned particles may have useful applications. Some possible applications are: magnetic random access memory (MRAM), which is faster or smaller than the RAMs currently in use, and most importantly, it is non-volatile (meaning it is not erased when one turns the computer off). In addition, the material of the present invention can be used as magnetic field sensors and used in spin-transistors.

BRIEF DESCRIPTION OF THE SEVERAL VIEWS OF THE DRAWINGS

For a further understanding of the nature, objects, and advantages of the present invention, reference should be had to the following detailed description, read in conjunction with the following drawings, wherein.

DETAILED DESCRIPTION OF THE INVENTION

The present inventors use the needle-shaped $CrO_2$ single domain powders and align them along the direction of a strong applied magnetic field. It is found that the aligned powder sample of the present invention is strongly anisotropic. The MR of the aligned powders exhibits a behavior bearing a resemblance to that of the magnetic tunneling junctions (MTJ) and shows a sharp switching effect at the coercive field of about 1000 Oe.

Figure 1:
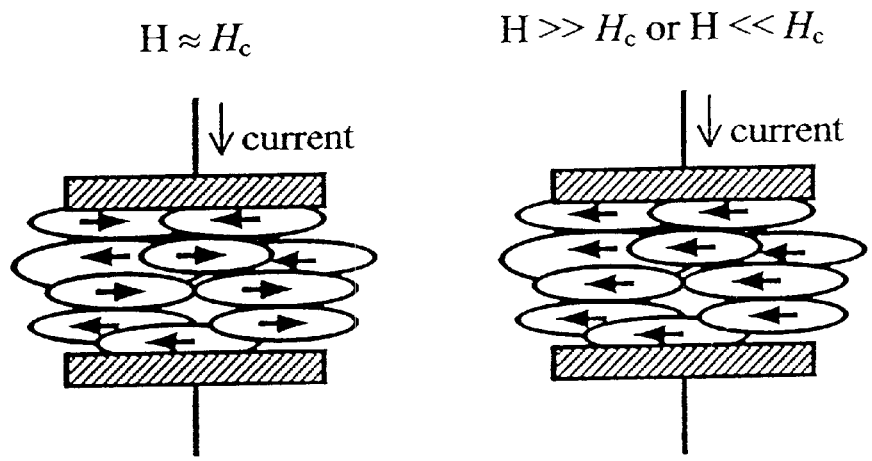
FIG. 1 shows aligned magnetic moments of CrO2 powders and the structure of transport measurement.

In the inventors' experiments, samples were made from pure commercial $CrO_2$ powders for magnetic recording supplied by DuPont. The ferromagnetic powders were characterized by x-ray diffraction and transmission electronic microscopy (TEM). The single-domain $CrO_2$ particles are needle-shaped with an aspect ratio around 9:1. The easy magnetic axis is along the needle and the average length is about 400 nm as determined from TEM micrographs. The powders were added to ethanol with a 1:200 ratio, and an ultrasonic shaker was used to break the aggregates for uniform distribution of the $CrO_2$ particles in the suspension. The suspension was dropped onto a polymer substrate at room temperature in a magnetic field of 1 T. After drying, the needle-shaped $CrO_2$ powders became affixed to the substrate and were aligned along the direction of the magnetic field. Two electrode contacts were made by silver paste. The size of the measured samples was about 100 $\mu$m. Transport measurements were made using a Quantum Design physical properties measurement system (PPMS), and the magnetization curves were measured by a SQUID magnetometer. FIG. 1 gives a schematic view of the alignment effect of $CrO_2$ nano powders and the structure of transport measurement.

Figure 2:
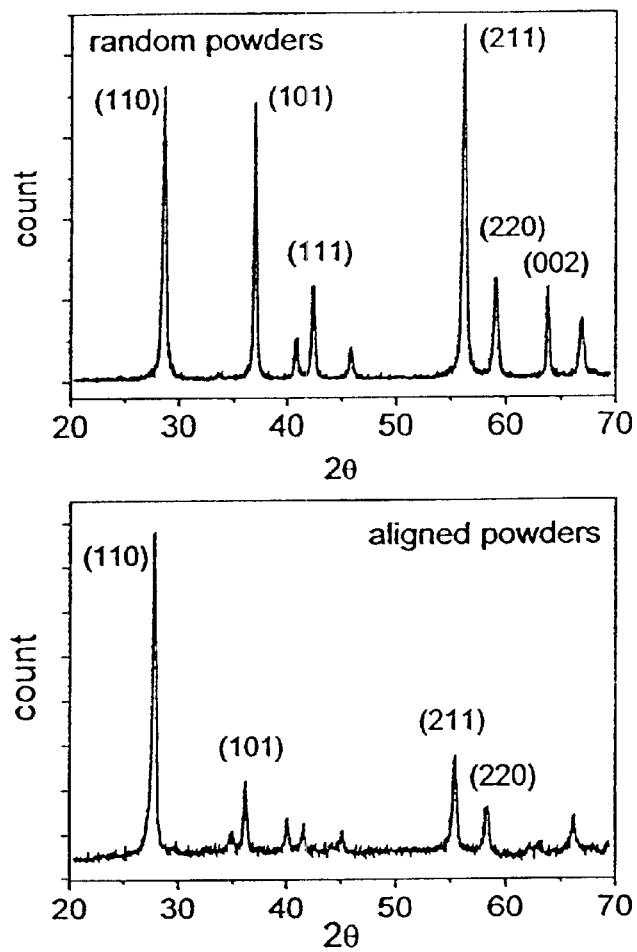
FIG. 2 shows X-ray diffraction patterns of the random and aligned powders.
Figure 3:
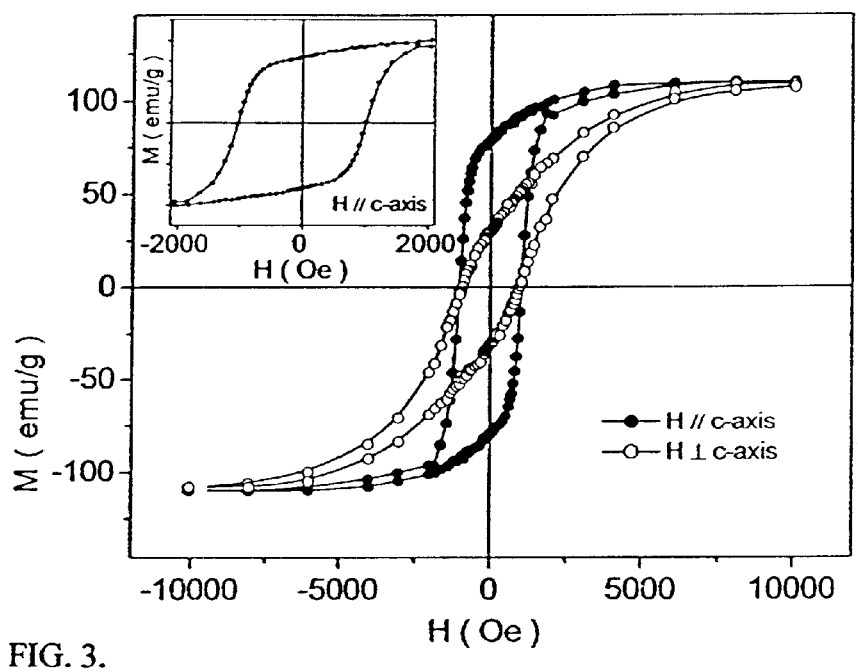
FIG. 3 shows the hysteresis loops of the aligned powders at T=5 K: field parallel to the easy axis and perpendicular to the easy axis; the inset shows the hysteresis loop (field applied parallel to the easy axis) over smaller field range

FIG. 2 shows the x-ray diffraction patterns of the aligned powders in comparison with the random powders. One can see that the (110) plane shows strong diffraction and the intensities of (101), (111) and (211) are substantially suppressed. The (002) peak virtually disappears from the pattern of the aligned powders. The powders are aligned along the c-axis and show an x-ray diffraction pattern typical of textured materials. The dominant anisotropy here is the shape anisotropy and the easy axis is along the length of the particles, which is the c-axis. Due to the high aspect ratio, the aligned $CrO_2$ powder sample exhibits strong anisotropy. FIG. 3(a) gives the magnetization curves of the aligned sample when the applied field is parallel to the easy axis. One can see that when the applied field is parallel to the easy axis (alignment direction), the hysteresis loop is close to a square with a high remanence and shows a coercivity about 1000 Oe. The saturation magnetization $M_S$ is about 110 emu/g. When the magnetic field is perpendicular to the easy axis, the hysteresis loop becomes more gradual and rounded with a much-reduced remanence as shown in FIG. 3(b). The coercivity is not changed for the perpendicular orientation, which may be due to imperfect alignment.

Figure 4:
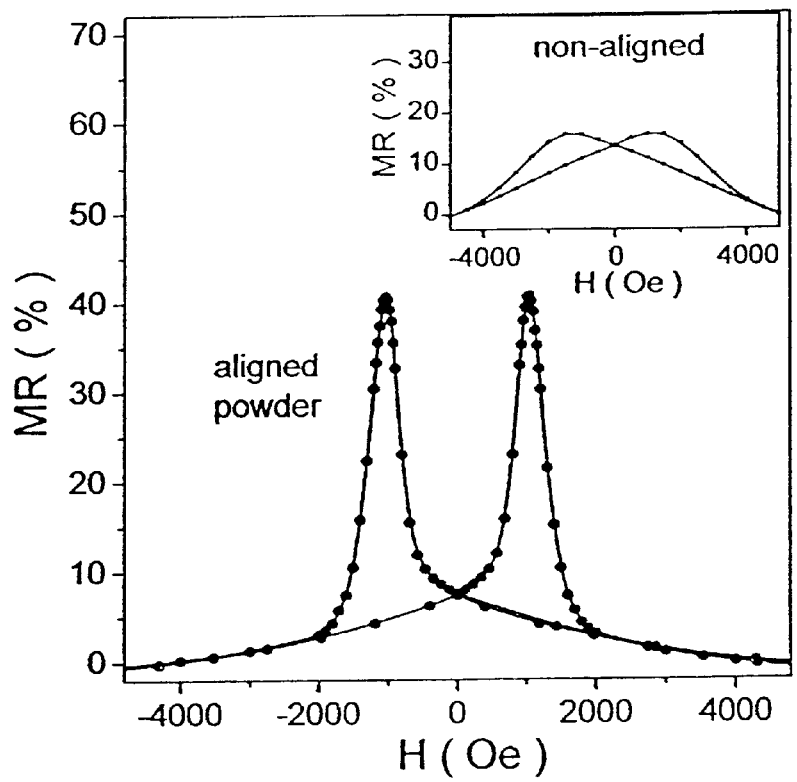
FIG. 4 shows. TMR of the aligned powders at T=5 K. Inset shows the MR at 5 K of cold-pressed powders with random orientation, over the same field range.

The magnetotransport measurements have been made on the aligned powder sample with the magnetic field applied along the easy axis. FIG. 4 shows the MR versus field curve at 5 K. The MR ratio is defined as $(R-R_H)/R_H$ where $R_H$ is the resistance at high field. The MR is about 41% at T=5 K and is characterized by two well-separated peaks near the coercive field H c=1000 Oe. Unlike random powder compacts, whose MR curves are typically "butterfly" shaped, the aligned powders exhibit sharp switching of the resistance between high and low states in a small field region in the vicinity of the coercive field. The switching behavior is similar to that of a magnetic tunneling junction. This junction-like MR is attributed to the fact that there is a narrow distribution of the switching field of the magnetic moments of the aligned powders as seen in FIG. 3(a). As the field is decreased to zero from the saturation, nearly all moments remain in the original direction and result in the low resistance state near zero field. The situation is different for the random powders where a significant portion of the moments are already misaligned as soon as the field is reduced to near zero leading to a large increase in the resistance. The inset of FIG. 4 shows the MR over the same range of the applied field of a cold-pressed sample using the same $CrO_2$ powders but without the field alignment. One sees that both the low field MR ratio and the sharpness of the switching effect of the random powders are much lower than those of the aligned powders. There is no significant change of the MR when the direction of the current is changed from parallel to the easy axis to perpendicular to the easy axis.

Figure 5:
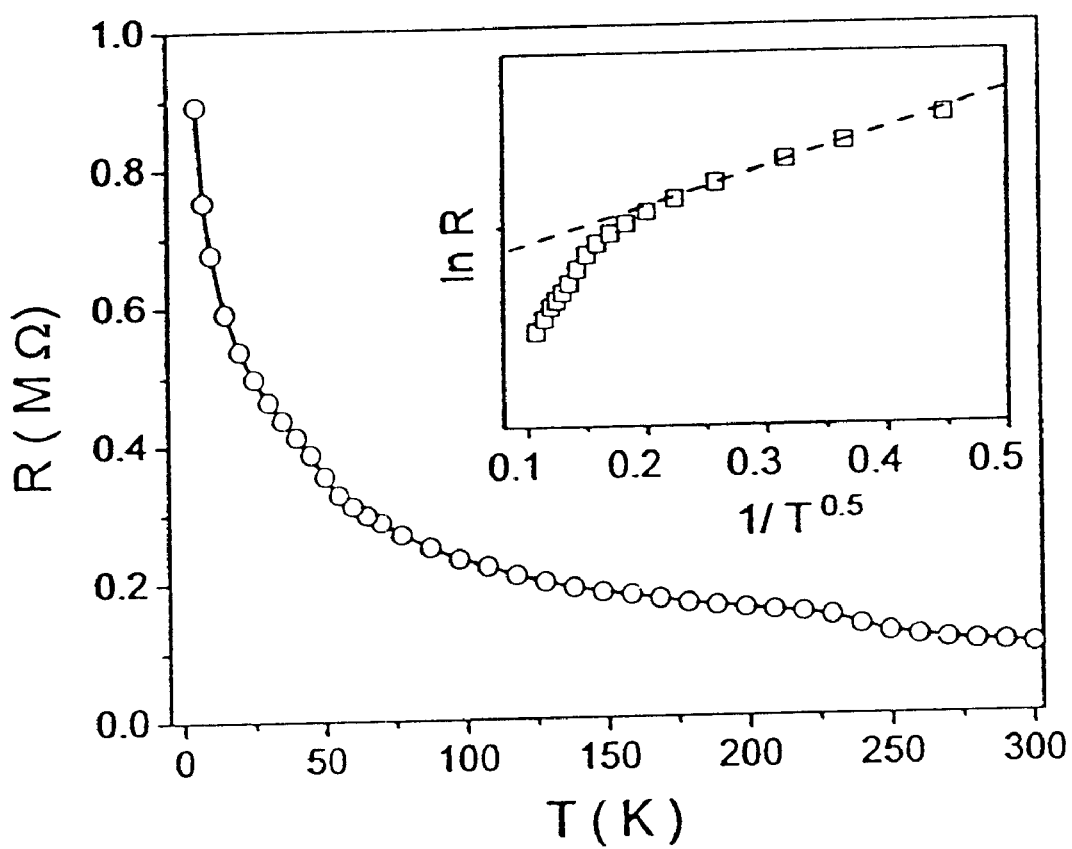
FIG. 5 shows temperature dependence of the resistance R. Inset plots lnR as a function of $1/T^{1/2}$.

The conduction mechanism of the $CrO_2$ powder compact has been analyzed by Coey et al. [9] and is associated with the spin dependent intergranular tunneling across the grain boundaries. FIG. 5 shows the temperature dependence of the resistance R, and the inset plots the InR as a function of $1/T^{1/2}$. One can see that InR is linear to $1/T^{1/2}$ when temperature is lower than 35 K, which is typical of intergranular tunneling associated with a Coulomb gap. The tunneling resistance as a function of temperature is usually given by [12–14]

$$R_{Tun} \propto (1+P^2m^2)^{-1} \exp(\Delta/T)^{1/2}, \quad (1)$$

where P is the spin polarization, m=M/Ms is the relative magnetization, and $\Delta$ is proportional to the Coulomb charging energy and barrier thickness. In the sample of the present invention $\Delta$ is about 5.5 K, which is determined from the slope of the linear region of the $InR \sim 1/T^{1/2}$ curve. The linear relationship between InR and $1/T^{1/2}$ at T<35 K implies the intergranular tunneling is the main contribution to the conductance at low temperatures. At high temperature a spin independent conductance channel opens up due to higher-order inelastic hopping through the localized states in the barrier [15].

The MR behavior is directly related to the switching of the magnetic moments of each single domain particle. The conductance of the aligned powder sample is through the intergranular tunneling between a pair of neighboring particles. Ideally, the magnetic moments are completely aligned in the same direction as the applied field when $H>>H_c$. In this case the spin dependent tunneling between neighboring particles has a high tunneling probability and the sample shows low resistance. When H is close to the coercivity field $H_c$, the magnetic moments of a portion of the particles are reversed, which causes antiparallel alignment of the moments of neighboring particles and reduces the tunneling conductance. The number of the antiparallel alignments peaks at $H_c$ leading to the maximum value of the resistance. This corresponds to m=0 in Eq. (1), where the magnetic moments of one half of the particles are switched. When $H>>H_c$ or $H<<H_c$, the magnetic moments are aligned and the sample shows low resistance. The switching process of the magnetic moments in the aligned sample of the present invention is also illustrated in FIG. 1. The uniqueness of the aligned powder sample is that there is a very narrow field region around $H_c$ over which the moments reverse their directions. Therefore practically all moments are aligned leading to the low resistance outside that region.

The tunneling process in the aligned powder sample can be approximately described as a network of many magnetic tunneling junctions, in which the boundary between each pair of neighboring particles is an individual junction. Considering the nearly 100% spin polarization of $CrO_2$, a tunneling path is either open or closed, and one can anticipate an extremely high MR of this MTJ network. However, in the system of the present invention, at the coercive field, there are always those junctions where the two neighboring particles are aligned parallel (open) and those junctions that are in the closed states. Higher MR than the observed value here is possible if one can appropriately control the relative orientation of the neighboring particles.

The temperature dependence of MR of the aligned $CrO_2$ powders has also been studied. It is found that, at higher temperature, the MR ratio drops down quickly. MR becomes less than 1% at room temperature. The decrease of MR at high temperature can be analyzed in terms of spin independent conductance (and spin flip effect) which become dominant with increasing temperature [15,16]. It is not clear if there is any possible suppression of the spin polarization of $CrO_2$ at high temperatures, which may also reduce the MR.

There are several kinds of structures of $CrO_2$ that have been studied by different groups for the spin dependent magnetotransport properties. Table I lists the experimental results of the MR of $CrO_2$ of different structures obtained from the literature. Comparing to those results, one can see that the aligned powders have a high MR value and a well-defined low switching field, which may be suitable for many applications. In addition, comparing to the thin film structures, e.g., spin valves and magnetic tunneling junctions, the aligned powder structure is easy to make. The aligned $CrO_2$ magnetic particles and similar designs can find potential use in novel spin transport devices and be useful for possible industrial applications provided the temperature characteristics are further improved [16].

References (all Incorporated Herein by Reference)

[1] K. Schwarz, J Phys. F 16, L211 (1986)
[2] K. P. Kamper, W. Schmitt, and G. Guntherodt, Phys. Rev. Lett, 59, 2788 (1987)
[3] R. J. Soulen, et al, Science 282, 85 (1998)
[4] R. Wiesendanper, H. J. Guntherodt, G. Guntherodt, R. J. Gambino, R. Ruf, Phys. Rev. Lett. 65, 247 (1990)
[5] J. S. Moodera, L. R. Kinder, T. M. Wong, and R. Meservey, Phys. Rev. Lett. 74,3273 (1995)
[6] H. Y. Hwang and S. W. Cheong, Science 278, 1607 (1997)
[7] K Suzuki and P. M. Tedrow, Appl. Phys. Lett, 74, 428 (1999); K Suzuki and P. M. Tedrow, Phys. Rev. B, 58, 11597 (1998)
[8] S. S. Manoharan, D. Elefant, G. Reiss, J. B. Goodenough, Appl. Phys. Lett., 72, 984(1998)
[9] J. M. D. Coey, A. E. Berkowitz, L. Balcells, and F. F. Putris, Phys. Rev. Lett., 80, 3815 (1998)
[10] M. Garcia-Hernandez, F. Guinea, A. Andres, J. L. Martinez, C. Prieto, and L. Vazquez, Phys. Rev. B, 61, 9549(2000)
[11] A. Barry, J. M. D. Coey, and M. Viret, J. Phys. Cond. Matt., 12, L173 (2000)
[12] J. Inoue and S. Maekawa, Phys. Rev. B, 53, 11929 (1996)
[13] S. Mitani, S. Takahashi, K. Takanashi, K. Yakushiji, S. Maekawa, and H. Fujimori, Phys. Rev. Lett., 81, 2799 (1998)
[14] T. Zhu and J. Wang, Phys. Rev. B, 60, 11918 (1999)
[15] C. H. Shang, J. Nowak, R. Jansen, and J. S. Moodera, Phys. Rev. B 58, 2917 (1998)
[16] J. Dai and J. Tang, Phys. Rev. B, 63, 064410 (2001) (copy attached).

Also incorporated herein by reference are the following, copies of which are attached:

"Low field intergranular tunneling effect in $CrO_2$ nanoparticles and characterization of the barriers", JOURNAL OF APPLIED PHYSICS, VOLUME 89, NUMBER 11, JUN. 1, 2001, pp. 6763–6765;

"Junction-like magnetoresistance of intergranular tunneling in field-aligned chromium dioxide powders", PHYSICAL REVIEW B, VOLUME 63, 054434 (2001), pp. 054434-1–054434-4;

"Characterization of the natural barriers of intergranular tunnel junctions: $Cr_2O_3$ surface layers on $CrO_2$ nanoparticles", APPLIED PHYSICS LETTERS, VOLUME 77, NUMBER 18, pp. 2840–2842.

TABLE 1

| Composition | structure | MR | field[a] (Oe) | source |
|---|---|---|---|---|
| $CrO_2$ | polycrystalline film (on $SiTrO_3$) | ~13% | 50,000 | Ref. 6 |
| $CrO_2$ + $Cr_2O_3$ | polycrystalline film (on $SiTiO_3$) | 27% (22%) | 50,000 (~7,500) | Ref. 6 |
| $CrO_2$ | crystal film (On $ZnO_2$) | ~4% | 20,000 | Ref. 7 |
| $CrO_2$ | crystal film (On $TiO_2$) | ~12% | 70,000 | Ref. 7 |
| $CrO_2$ | cold-pressed | 42% (~30%) | 50,000 (10,000) | Ref. 8 |
| $CrO_2$ | cold-pressed | ~30% (28%) | 50,000 (20,000) | Ref. 9 |

TABLE 1-continued

| Composition | structure | MR | field[a] (Oe) | source |
|---|---|---|---|---|
| 25% $CrO_2$, 75% $Cr_2O_3$ | cold pressed | ~50% | 50,000 | Ref. 9 |
| $CrO_2$ | aligned powders | ~41% | 1,000 | this work |
| $CrO_2$-I-Co | tunneling junction | ~1% | 50 | Ref. 11 |

[a]The magnetic field at which the indicated MR ratio is reached.

More information about the invention can be found in the paper attached to the provisional patent application and entitled: "Junction-Like Magnetoresistance of Intergranular Tunneling in Field-Aligned Chromium Dioxide Powders", J. Dai and J. Tang, Phys. Rev. B, 63, 054434 (2001), which, with all references it cites, is incorporated herein by reference.

Ethanol was used as the organic solvent in the evaporation technique of the present invention, but acetone, methanol and many other organic solvents should all work the same.

The powders used in developing the present invention were a commercial product made by Du Pont, but the powders could be made in a lab using high pressure hydrothermal reaction. Simply put, CrO2 powders can be made by hydrothermal decomposition reaction of CrO3 in the presence of H2O and O2, which are sealed in a pressure cell and heated.

All measurements disclosed herein are at standard temperature and pressure, at sea level on Earth, unless indicated otherwise. All materials used or intended to be used in a human being are biocompatible, unless indicated otherwise.

The foregoing embodiments are presented by way of example only; the scope of the present invention is to be limited only by the following claims.

What is claimed is:

1. An article comprising a magnetoresistive material that comprises $CrO_2$ powders fixed in a position in which the $CrO_2$ powders are aligned in the same direction in a magnetic field.

2. The article of claim 1, wherein the $CrO_2$ powders are fixed to a substrate by evaporating the an organic solvent.

3. The article of claim 1, wherein the $CrO_2$ powders have a $Cr_2O_3$ insulating surface layer of thickness of about 1–3 nm.

4. The article of claim 1, wherein the magnetoresistance ratio is at least 10%, at a temperature of 5 degrees Kelvin and a magnetic field of 1000 Oersted.

5. The article of claim 4, wherein the magnetoresistance ratio is at least 20%, at a temperature of 5 degrees Kelvin and a magnetic field of 1000 Oersted.

6. The article of claim 1, wherein the magnetoresistive material is disposed in the article as a layer having a thickness of about 1 nm to about 100 mm.

7. The article of claim 1, wherein the magnetoresistive material comprises one, two or more $CrO_2$ grains having an average grain size of about 10 nm to about 50 mm.

8. An article comprising a magnetoresistive structure that comprises a first layer consisting essentially of $CrO_2$ particles aligned in a magnetic field, a second layer consisting essentially of $Cr_2O3$, and a third layer consisting essentially of $CrO_2$ or other magnetic conductors.

9. The article of claim 8, wherein the $CrO_2$ in the first and/or third layers is single crystal $CrO_2$.

10. The invention of claim 8, wherein the magnetoresistive material exhibits a magnetoresistance ratio greater than 20%, at a temperature of 5 degrees Kelvin and a magnetic field of 1000 Oersted.

11. The invention of claim 8, wherein the magnetoresistive material exhibits a magnetoresistance ratio greater than 30%, at a temperature of 5 degrees Kelvin and a magnetic field of 1000 Oersted.

12. The invention of claim 8, wherein the magnetoresistive material exhibits a magnetoresistance ratio greater than 40%, at a temperature of 5 degrees Kelvin and a magnetic field of 1000 Oersted.

13. The invention of claim 8, wherein the magnetoresistive material is used in magnetic random access memory (MRAM), such as MRAM for computers.

14. The invention of claim 8, wherein the magnetoresistive material is used in a magnetic field sensor.

15. The invention of claim 8, wherein the magnetoresistive material is used in a spin-transistor.

16. A method for making an article that comprises a magnetoresistive material, comprising the steps of:

aligning $CrO_2$ particles in the same direction in a magnetic field; and fixing the $CrO_2$ particles in a layer.

17. The method of claim 16, wherein the $CrO_2$ layer has a thickness of about 1 nm to about 100 mm.

18. The method of claim 16, wherein the magnetoresistive material exhibits a magnetoresistance ratio greater than 10%, at a temperature of 5 degrees Kelvin and a magnetic field of 1000 Oersted.

19. The method of claim 16, wherein the $CrO_2$ has an average grain size of about 10 nm to about 50 mm.

* * * * *